United States Patent
Ma

(10) Patent No.: US 6,561,817 B1
(45) Date of Patent: May 13, 2003

(54) ELECTRICAL SOCKET HAVING MINIMAL WIPING TERMINALS

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/104,903

(22) Filed: Mar. 21, 2002

(30) Foreign Application Priority Data

Jan. 11, 2002 (TW) .......................................... 91200170

(51) Int. Cl.7 .............................................. H01R 12/00
(52) U.S. Cl. ........................................ 439/66; 439/71
(58) Field of Search ................................ 439/342, 862, 439/66, 71

(56) References Cited

U.S. PATENT DOCUMENTS

| | | | |
|---|---|---|---|
| 5,308,252 A | * 5/1994 | Mroczkowski et al. | 439/66 |
| 6,164,978 A | * 12/2000 | McHugh et al. | 439/66 |
| 6,179,624 B1 | * 1/2001 | McHugh et al. | 439/66 |
| 6,186,797 B1 | * 2/2001 | Wang et al. | 439/66 |
| 6,193,524 B1 | * 2/2001 | Chang | 439/66 |

* cited by examiner

*Primary Examiner*—Gary Paumen
(74) *Attorney, Agent, or Firm*—Wei Te Chung

(57) ABSTRACT

An electrical socket (1) includes a housing (10) and a plurality of terminals (30) received in the housing. Each terminal includes a securing portion (34) secured in the housing, a mating portion (33), and a spring portion (32) connected between the securing portion and the mating portion. When the socket connects with a complementary electronic device (2), the spring portion is resiliently deformed to provide resilient force to the mating portion, and the mating portion therefore engages with the electronic device with minimal wiping relative to the electronic device.

1 Claim, 5 Drawing Sheets

ELECTRICAL SOCKET HAVING MINIMAL WIPING TERMINALS

BACKGROUND OF THE INVENTION

1. Field of the Invention

The present invention relates to electrical sockets, and particularly to a land grid array (LGA) socket having minimal wiping terminals.

2. Related Art

Electrical connectors are widely used in electronic devices for readily interconnecting with other electronic devices. Typically, an electrical connector includes a dielectric housing and a plurality of terminals received in the housing. The connector is mounted on an electronic device, for connection with a complementary connector. Nowadays, electrical signal transmission is frequently high speed and high frequency. This requires highly secure connection between the terminals and complementary components.

A conventional terminal for an LGA socket includes a mating portion for engaging with a pad of an electronic device such as a central processing unit (CPU), a soldering portion for being soldered to a printed circuit board (PCB), and a connecting portion between the mating portion and the soldering portion.

When the terminal engages with the pad, the mating portion rotates about a junction of the mating portion and the connecting portion. Therefore, the mating portion frictionally wipes the pad. This can result in poor connection between the terminal and the pad.

SUMMARY OF THE INVENTION

Accordingly, an object of the present invention is to provide an electrical socket having minimal wiping terminals for securely connecting with a complementary electronic device.

To achieve the above-mentioned object, an electrical socket in accordance with the present invention includes a housing and a plurality of terminals received in the housing. Each terminal includes a securing portion secured in the housing, a mating portion, and a spring portion connected between the securing portion and the mating portion. When the socket connects with a complementary electronic device, the spring portion is resiliently deformed to provide resilient force to the mating portion, and the mating portion therefore engages with the electronic device with minimal wiping relative to the electronic device.

Other objects, advantages and novel features of the present invention will be drawn from the following detailed description of a preferred embodiment of the present invention with attached drawings, in which:

DETAILED DESCRIPTION OF THE PREFERRED EMBODIMENT

Figure 1:
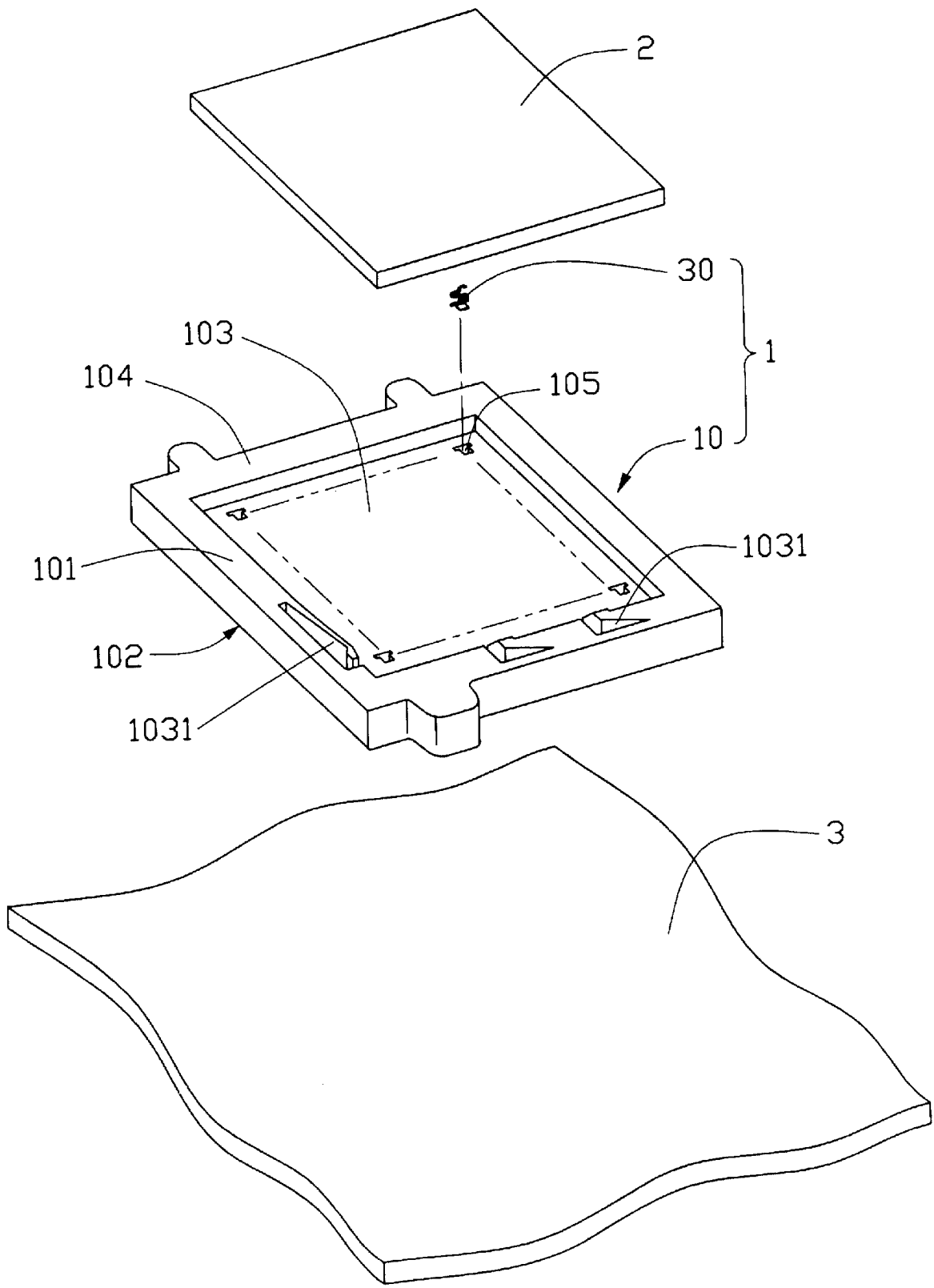
FIG. 1 is an exploded perspective view of an LGA socket in accordance with the present invention for connection between a CPU and a PCB, but only showing limited numbers of components of the LGA socket for simplicity.
Figure 2:
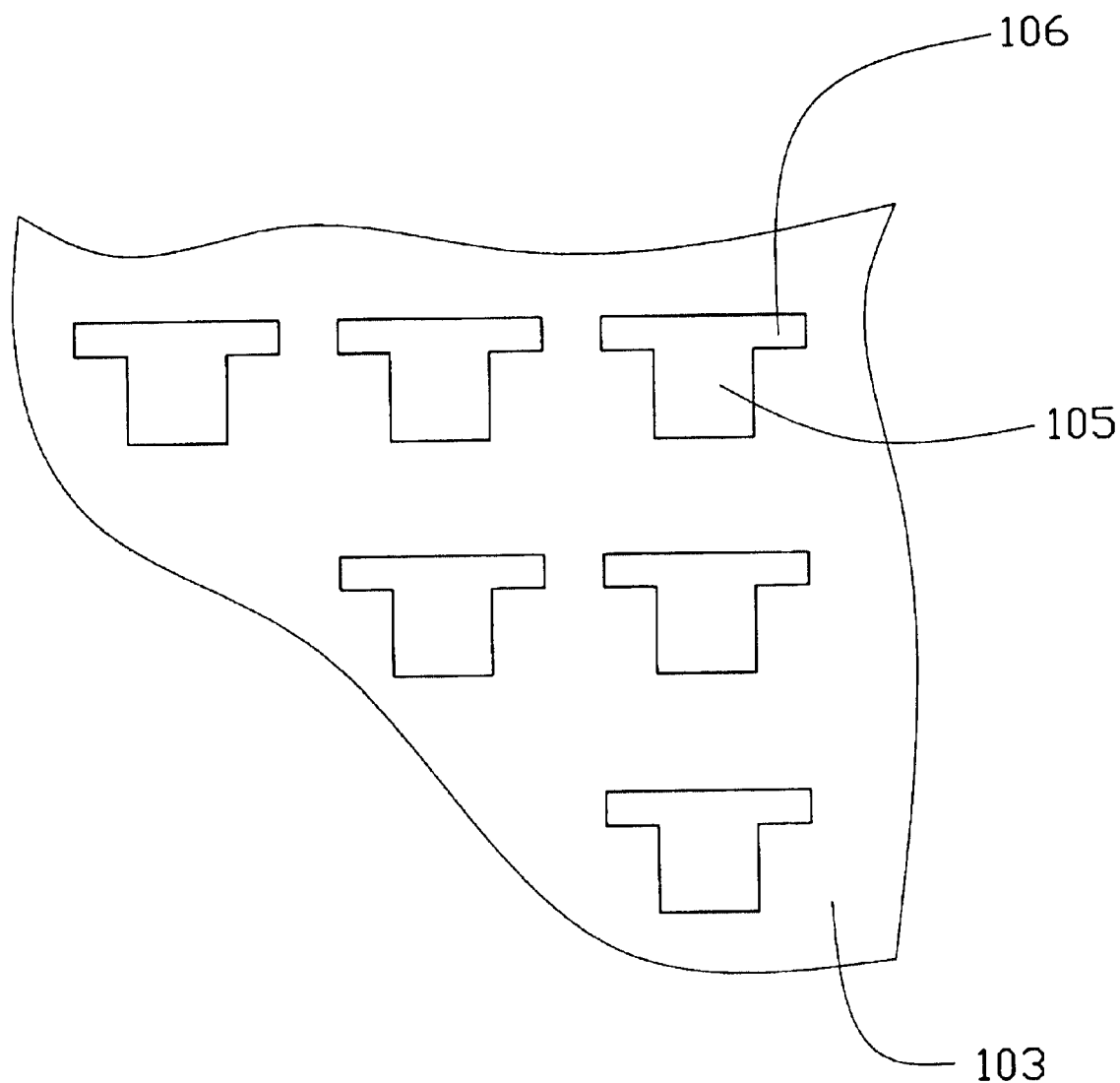
FIG. 2 is a top plan view of part of a receiving section of a housing of the LGA socket of FIG. 1.
Figure 3:
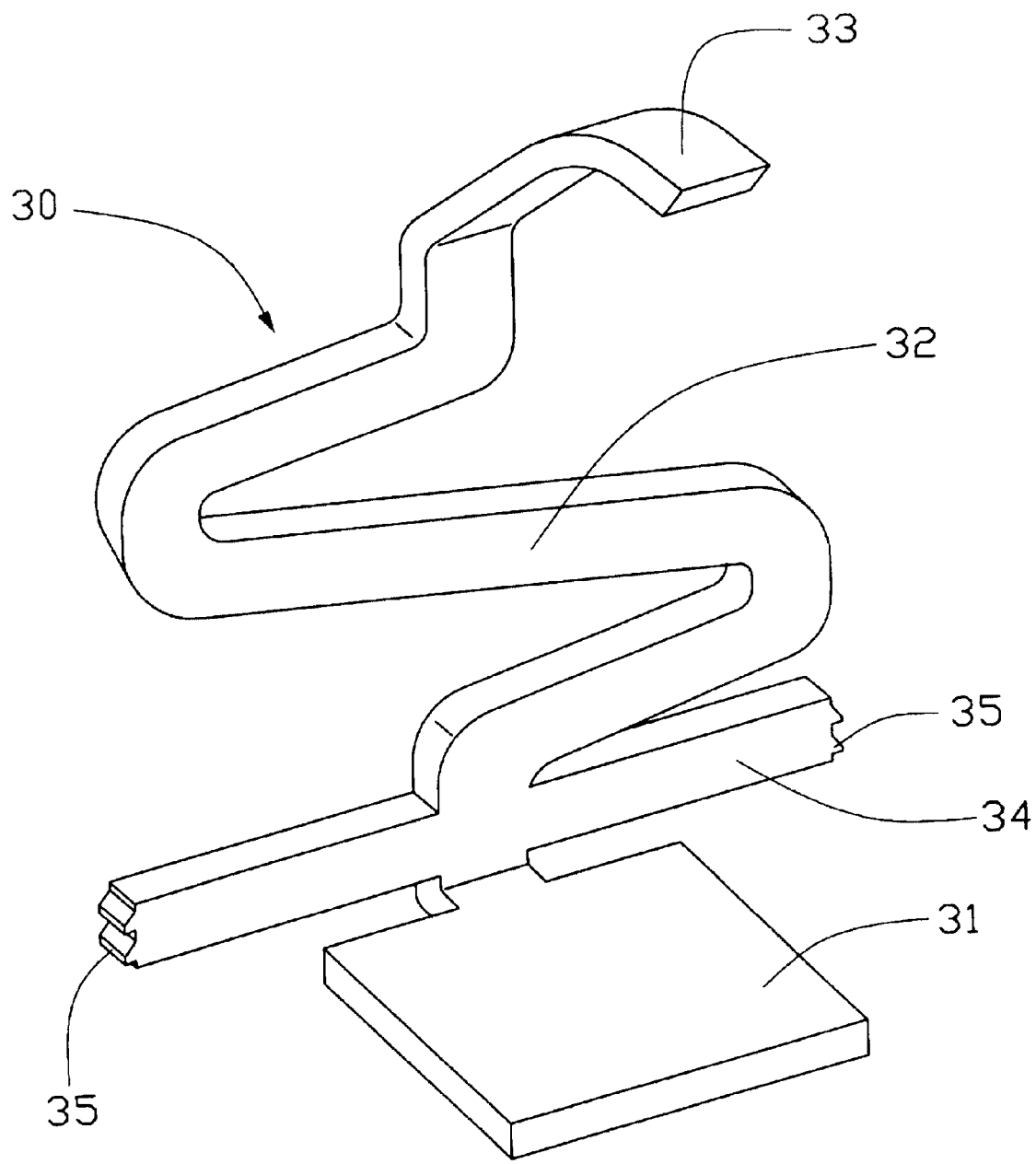
FIG. 3 is a perspective view of a terminal of the LGA socket of FIG. 1.

Referring to FIGS. 1–3, an LGA socket 1 in accordance with the present invention for connecting with a CPU 2 and a PCB 3 includes a dielectric housing 10 and a plurality of terminals 30 (only one shown) received in the housing 10. The housing 10 includes a top surface 101 and an opposite bottom surface 102. A recessed receiving section 103 is formed in a middle portion of the housing 10, thereby forming a peripheral wall 104 of the housing 10. The receiving section 103 receives the CPU 2 therein. A plurality of resilient arms 1031 is formed along an inner periphery of the peripheral wall 104. The resilient arms 1031 abut against the CPU 2 received in the receiving section 103. A plurality of passages 105 is defined in the receiving section 103. Each passage 105 is generally T-shaped, and includes an elongate fixing section 106. The passages 105 receive the terminals 30 therein.

Figure 4:
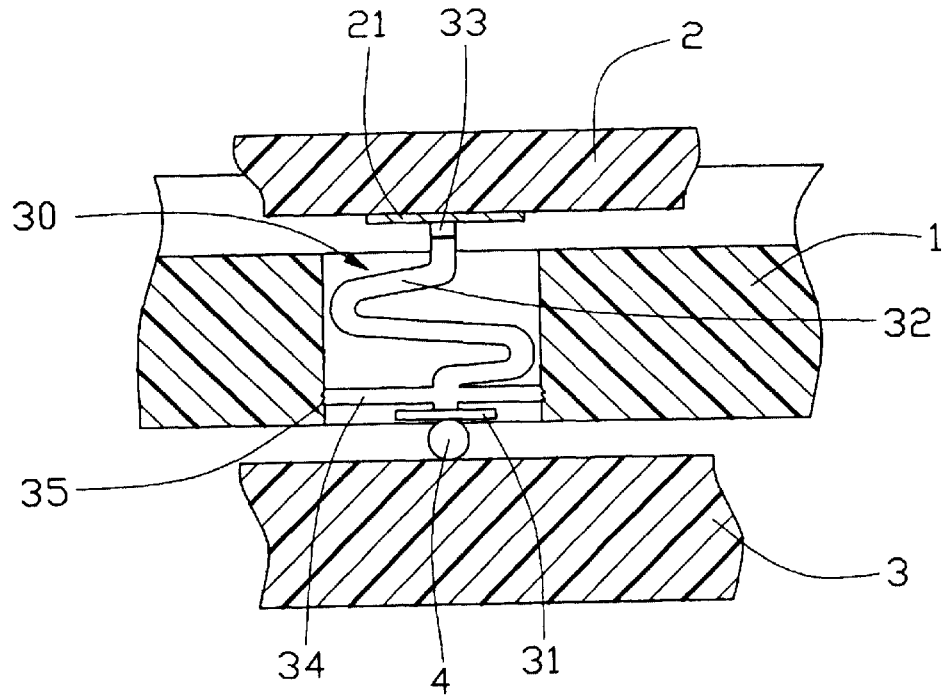
FIG. 4 is a partial cross-sectional view of the LGA socket of FIG. 1 mounted on the PCB for connection with the CPU.
Figure 5:
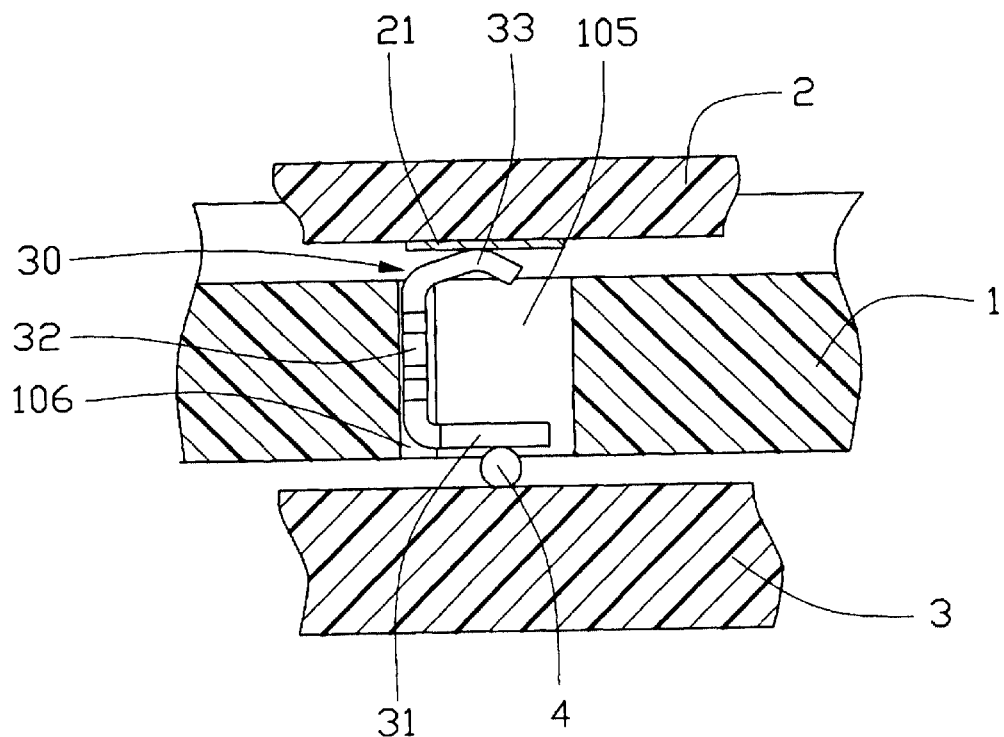
FIG. 5 is similar to FIG. 4, but viewed from a left side aspect of FIG. 4.
Figure 6:
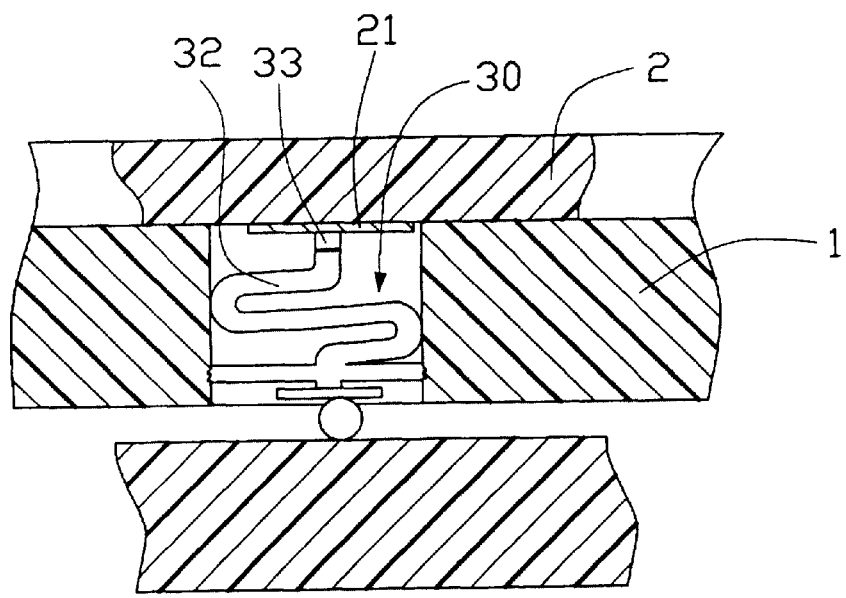
FIG. 6 is a partial cross-sectional view of the LGA socket of FIG. 1 mounted on the PCB and connected with the CPU.
Figure 7:
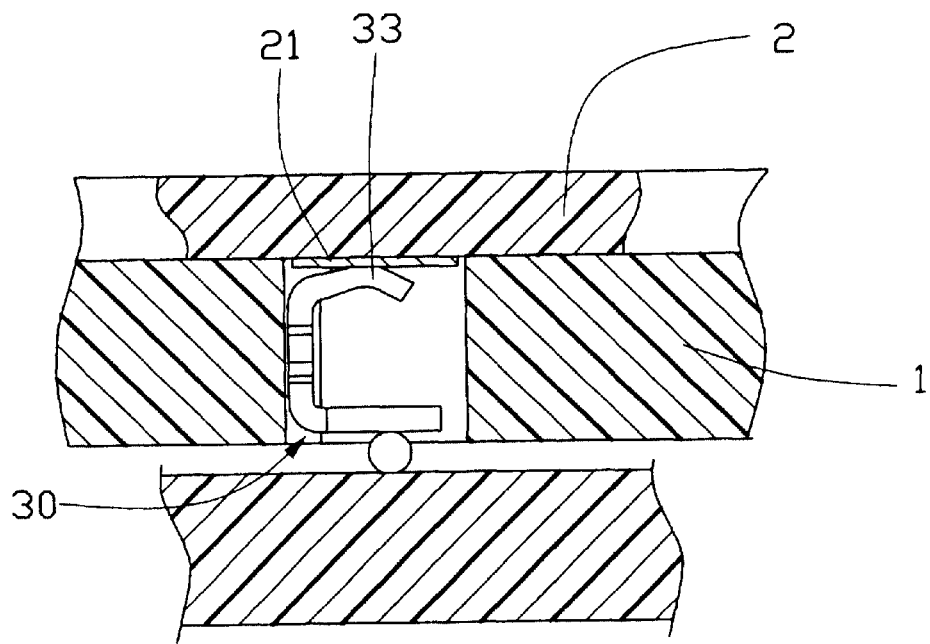
FIG. 7 is similar to FIG. 6, but viewed from a left side aspect of FIG. 6.

Each terminal 30 includes a bottom soldering portion 31 for being soldered to the PCB 3, an intermediate spring portion 32, and a top mating portion 33 extending from the spring portion 32 for mating with the CPU 2. A horizontal securing portion 34 is formed between the soldering portion 31 and the spring portion 32. A pair of barbs 35 extends from each of opposite ends of the securing portion 34. The barbs 35 are interferentially received in the corresponding fixing section 106 of the housing 10 (see FIGS. 4–5). The spring portion 32 is generally S-shaped and coplanar with the securing portion 34, and is resiliently deformable in a plane. The soldering portion 31 and the mating portion 33 are located at opposite ends of the terminal 30, and at a same side of the spring portion 32. The mating portion 33 is generally arcuate. When force is exerted down on the mating portion 33, the spring portion 32 resiliently deforms more readily than the mating portion 33.

Referring to FIGS. 4–7, when the socket 1 interconnects between the CPU 2 and the PCB 3, the soldering portion 31 of the terminal 30 is connected with the PCB 3 via a solder ball 4. The mating portion 33 of the terminal 30 engages with a conductive pad 21 of the CPU 2. Because the spring portion 32 resiliently deforms more readily than the mating portion 33, the spring portion 32 urges the mating portion 33 to connect with the conductive pad 21, and the mating portion 33 undergoes minimal resilient deformation. The spring portion 32 provides ample resilient force to ensure stable connection between the mating portion 33 and the conductive pad 21. Thus, the mating portion 14 undergoes minimal wiping relative to the CPU 2. Accordingly, secure and reliable connection between the socket 1 and the CPU 2 is obtained.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. An LGA socket assembly comprising:
   a insulative housing;
   a plurality of passages extending through the housing vertically;

a plurality of terminals retained in the corresponding passages, respectively, each of said terminals including a solder portion extending around a bottom face of the housing and a mating portion extending out of the top face of the housing, an intermediate spring portion positioned between said solder portion and the mating portion; wherein when said mating portion is pressed downwardly by an external electronic component, said spring portion is deformable in a vertical direction on a vertical plane without resulting in any horizontal displacement at a distal end thereof, while the mating portion is deflectable to result in both vertical and horizontal movement for an uppermost contact point of the terminal;

wherein each of said passages defines a T-shaped configuration with the corresponding spring portion located in a horizontal section of said T-shaped configuration;

wherein said mating portion is deformable in another vertical plane perpendicular to said vertical plane;

wherein a securing portion is located between the spring portion and the solder portion;

wherein said spring portion defines an S-like configuration, and two inversed sections of said spring portion on two sides of said S-like configuration are engaged with the housing in a horizontal direction in said vertical plane when said spring portion is deformed, and are disengaged from the housing in said horizontal direction when said spring portion is relaxed.

* * * * *